United States Patent
Pendse

(10) Patent No.: US 8,141,247 B2
(45) Date of Patent: Mar. 27, 2012

(54) METHOD OF A PACKAGE ON PACKAGE PACKAGING

(75) Inventor: Rajendra D. Pendse, Fremont, CA (US)

(73) Assignee: Stats Chippac Ltd., Singapore (SG)

( * ) Notice: Subject to any disclaimer, the term of this patent is extended or adjusted under 35 U.S.C. 154(b) by 382 days.

(21) Appl. No.: 12/468,810

(22) Filed: May 19, 2009

(65) Prior Publication Data

US 2009/0223048 A1  Sep. 10, 2009

Related U.S. Application Data

(62) Division of application No. 11/424,202, filed on Jun. 14, 2006, now Pat. No. 7,550,680.

(51) Int. Cl.
*H01R 43/16* (2006.01)
*H01L 23/48* (2006.01)

(52) U.S. Cl. ............ 29/874; 29/831; 29/832; 29/852; 29/854; 29/879; 257/777

(58) Field of Classification Search .......... 29/832, 29/831, 846, 847, 852, 840, 879, 830, 854, 29/874; 257/777, 686, 723; 361/414, 406
See application file for complete search history.

(56) References Cited

U.S. PATENT DOCUMENTS

| | | | |
|---|---|---|---|
| 5,045,914 A * | 9/1991 | Casto et al. ............ | 257/693 |
| 5,222,014 A * | 6/1993 | Lin ...................... | 361/792 |
| 5,311,402 A * | 5/1994 | Kobayashi et al. ....... | 361/760 |
| 5,859,387 A | 1/1999 | Gagnon | |
| 5,984,166 A | 11/1999 | Holzmann | |
| 6,158,650 A | 12/2000 | Holzmann | |
| 6,211,642 B1 | 4/2001 | Holdaway | |
| 6,424,047 B1 | 7/2002 | Chua et al. | |
| 6,537,482 B1 | 3/2003 | Farnworth | |
| 6,781,241 B2 * | 8/2004 | Nishimura et al. ...... | 257/777 |
| 6,940,179 B2 | 9/2005 | Lee | |
| 6,946,601 B1 | 9/2005 | Lee et al. | |
| 6,968,613 B2 | 11/2005 | Tsai et al. | |
| 7,180,173 B2 | 2/2007 | Kuo et al. | |
| 2005/0121764 A1 | 6/2005 | Mallik et al. | |
| 2006/0261492 A1 | 11/2006 | Corisis et al. | |
| 2007/0045862 A1 | 3/2007 | Corisis et al. | |
| 2007/0069389 A1 | 3/2007 | Wollanke et al. | |
| 2007/0090532 A1 | 4/2007 | Lehman | |

* cited by examiner

*Primary Examiner* — Derris Banks
*Assistant Examiner* — Tai Nguyen
(74) *Attorney, Agent, or Firm* — Mikio Ishimaru

(57) ABSTRACT

A method of manufacture of an integrated circuit package-on-package system includes providing a base package and providing solder caps on the top of the base package configured to protrude above subsequent resin bleed, the resin bleed extending to an edge of the base package, and configured for merging with solder balls of a top package to form larger solder balls between such a top package and the base package.

8 Claims, 2 Drawing Sheets

METHOD OF A PACKAGE ON PACKAGE PACKAGING

CROSS-REFERENCE TO RELATED APPLICATION(S)

This is a divisional of U.S. patent application Ser. No. 11/424,202 filed Jun. 14, 2006, now U.S. Pat. No. 7,550,680.

TECHNICAL FIELD

The present invention relates generally to semiconductor technology, and more particularly to package-on-package packaging methods having a base package with pre-soldered landing pads.

BACKGROUND ART

Important and constant goals of the computer industry include higher performance, lower cost, increased miniaturization of components, and greater packaging density for integrated circuits ("ICs"). As new generations of IC products are released, the number of IC devices needed to fabricate them tends to decrease due to advances in technology. Simultaneously, the functionality of these IC products increases. For example, on the average there is approximately a 10 percent decrease in components required for every IC product generation over a previous generation having equivalent functionality.

Semiconductor package structures continue to become thinner and ever more miniaturized. This results in increased component density in semiconductor packages and decreased sizes of the IC products in which the packages are used. These developmental trends are in response to continually increasing demands on electronic apparatus designers and manufacturers for ever-reduced sizes, thicknesses, and costs, along with continuously improving performance.

These increasing requirements for miniaturization are particularly noteworthy, for example, in portable information and communication devices such as cell phones, hands-free cell phone headsets, personal data assistants ("PDA's"), camcorders, notebook personal computers, and so forth. All of these devices continue to be made smaller and thinner to improve their portability. Accordingly, large-scale IC ("LSI") packages incorporated into these devices, as well as the package configurations that house and protect them, must also be made smaller and thinner.

Many conventional semiconductor chip or die packages are of the type where a semiconductor chip is molded into a package with a resin, such as an epoxy molding compound. The packages have a leadframe whose out leads are projected from the package body to provide a path for signal transfer between the chip and external devices. Other conventional package configurations have contact terminals or pads formed directly on the surface of the package.

In IC packaging, in addition to component size reduction, surface mount technology ("SMT") has demonstrated an increase in semiconductor chip density on a single substrate (such as a printed circuit board ("PCB")) despite the reduction in the number of components. SMT is a method used to connect packaged chips to substrates. With SMT, no through-holes in the substrate are required. Instead, package leads are soldered directly to the substrate surface. This results in more compact designs and form factors, and a significant increase in IC density and performance. However, despite these several reductions in size, IC density continues to be limited by the space or "real estate" available for mounting chips on a substrate.

One method to further increase IC density is to stack semiconductor chips vertically. Multiple stacked chips can be combined into a single package in this manner with a very small surface area or "footprint" on the PCB or other substrate. This solution of stacking IC components vertically has in fact been extended to the stacking of entire packages upon each other. Such package-on-package ("PoP") configurations continue to become increasingly popular as the semiconductor industry continues to demand semiconductor devices with lower costs, higher performance, increased miniaturization, and greater packaging densities. Continuing substantial improvements in PoP solutions are thus greatly needed to address these requirements.

Unfortunately, limitations of current PoP packing techniques can interfere with the ready incorporation and utilization of existing die and package configurations. It can also interfere with and limit the development of necessary increases in the input/output ("I/O") connections that are needed and that need to be accommodated within such PoP packages as they grow ever more complex with ever increasing functionality and capability.

For example, in a previous PoP package configuration, the base package has landing pads on the top side that allow surface mounting of a top or second package. In order to successfully and effectively mount the top package on the base package, it is necessary to have sufficient clearance or "headroom" between the packages for accommodating structures, such as dies or a mold cap, on the top of the base package. However, typically due to cost and efficiency considerations, the only physical structure connecting the top package and the base package is the electrical interface between them. This electrical interface is usually a solder ball matrix on the bottom of the top package that aligns with landing pads on the top of the base package. Previous techniques employing such solder ball matrices usually afford only a small headroom or stand-off provided by the nominal height of the solder balls. This limits the available height for the base package components on the top of the base package, such as one or more semiconductor dies or a semiconductor mold cap. This then requires that the die(s) or mold cap on the base package has to be made excessively thin.

The problem of limited headroom is increasingly exacerbated by the need for more and more I/O connections between the top package and the base package. This means that the solder ball matrix on the bottom of the top package must have an ever-finer ball pitch in order to accommodate the higher and higher I/O counts. The consequence is that ball sizes must be smaller, and the headroom or stand-off becomes ever smaller and smaller as a result.

Another limitation of previous techniques is that the landing area (i.e., the available area for landing pads) that is available on the base package for mounting of the top package is limited by deficiencies in manufacturing process techniques. For example, resin bleed and/or mold flash can emanate from the flip chip underfill process for die(s) or the molding process that encapsulates any of the packages on the base. For example, the solder ball interface matrix for dies and/or packages on the top of the base package is commonly provided by such a chip underfill process. The consequent reduction in the landing area available on the base package then limits the maximum I/O count for the top package that can be accommodated within a given overall package size.

Thus, while a need still remains for smaller, thinner, lighter, less-expensive integrated circuit PoP systems, a great need also remains for PoP systems that respond to these needs when incorporating existing and increasingly complex die and package configurations. In view of the ever-increasing commercial competitive pressures, along with growing consumer expectations and the diminishing opportunities for meaningful product differentiation in the marketplace, it is critical that answers be found for these problems. Additionally, the need to save costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit package-on-package system including providing a base package and providing solder caps on the top of the base package configured to protrude above subsequent resin bleed, the resin bleed extending to an edge of the base package, and configured for merging with solder balls of a top package to form larger solder balls between such a top package and the base package.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
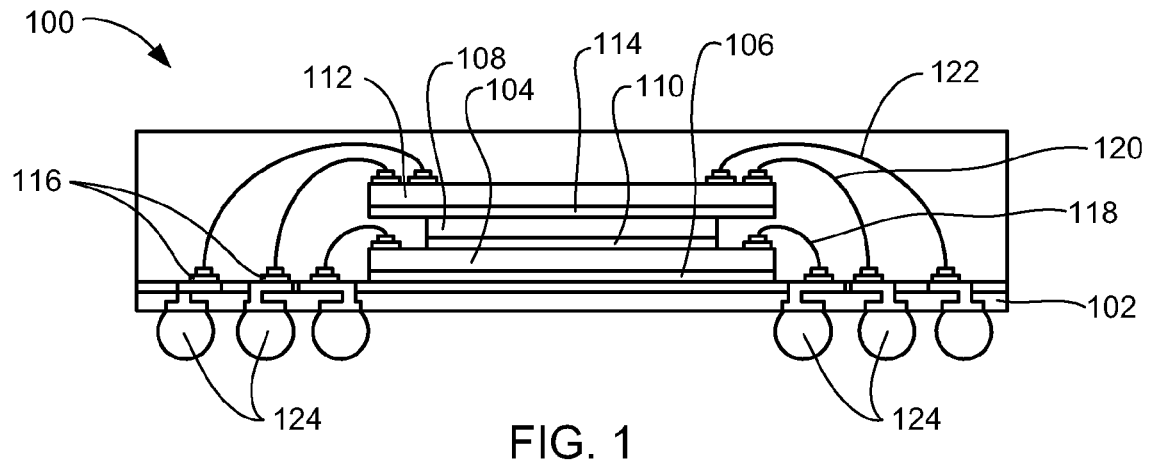
FIG. 1 is a view of a top package in accordance with an embodiment of the present invention.

The following embodiments are described in sufficient detail to enable those skilled in the art to make and use the invention. It is to be understood that other embodiments would be evident based on the present disclosure, and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Similarly, the drawings showing embodiments of the system are semi-diagrammatic and not to scale and, particularly, some of the dimensions are for the clarity of presentation and are shown greatly exaggerated in the drawing FIGS. Additionally, although the views in the drawings for ease of description generally show similar orientations, this depiction in the FIGS. is arbitrary for the most part. Generally, the invention can be operated in any orientation. Also, the same numbers are used in all the drawing FIGS. to relate to the same elements.

For expository purposes, the term "horizontal" as used herein is defined as a plane parallel to the plane or surface of the package substrate, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "processing" as used herein includes deposition of material or photoresist, patterning, exposure, development, etching, cleaning, and/or removal of the material or photoresist as required in forming a described structure.

Embodiments of the present invention afford solutions to the several needs and limitations of current package-on-package ("PoP") packing techniques. Such current practices interfere with the use of existing die and package configurations. They can also limit increases in the input/output ("I/O") connections that are needed as PoP packages grow ever more complex. This is particularly evident with the small headroom or stand-off provided by the limited height of the solder balls employed by previous techniques for connecting the top and base packages together. It is also evident from the contention between the need for oversized solder balls to provide sufficient headroom and the conflicting need for small solder balls to afford finer ball pitches for increasing I/O densities. The net result is a continuing need for smaller, thinner, lighter, less-expensive integrated circuit PoP systems that have universal capabilities to incorporate all package configurations, both existing as well as newer ones that are increasingly complex.

Embodiments of the present invention afford solutions to the several needs that result from such previous techniques by creating mounds or caps of solder on the landing pads on the top of the base package. These solder caps address, for example, the limitations having to do with restricted stand-off or headroom for the components on the top of the base package. The solder caps also address the limitations having to do with input/output ("I/O") count limitations for the top package that result from resin bleed and/or mold flash. Accordingly, it has been unexpectedly discovered that the solder caps according to embodiments of the present invention readily, efficiently, and inexpensively obviate these many significant limitations caused by previous techniques.

Referring now to FIG. 1, therein is shown a top package 100 according to an embodiment of the present invention. The top package 100 includes a substrate 102 such as a printed circuit board ("PCB"). A lower die 104 is attached to the top of the substrate 102 by an adhesive layer 106. A spacer 108 is attached to the top of the lower die 104, opposite the substrate 102, by an adhesive layer 110. An upper die 112 is attached to the top of the spacer 108, opposite the lower die 104, by an adhesive layer 114. The lower die 104 and the upper die 112 are electrically connected to landing pads 116 on the substrate 102 by bonding wires such as bonding wires 118, 120, and 122. Solder balls 124 are attached to the bottom of the substrate 102 opposite the lower die 104 and the upper die 112. The solder balls 124 form a flip chip configuration for electrically and physically attaching the top package 100 to a base package such as the base package 200 illustrated in FIG. 2B.

Figure 2A:
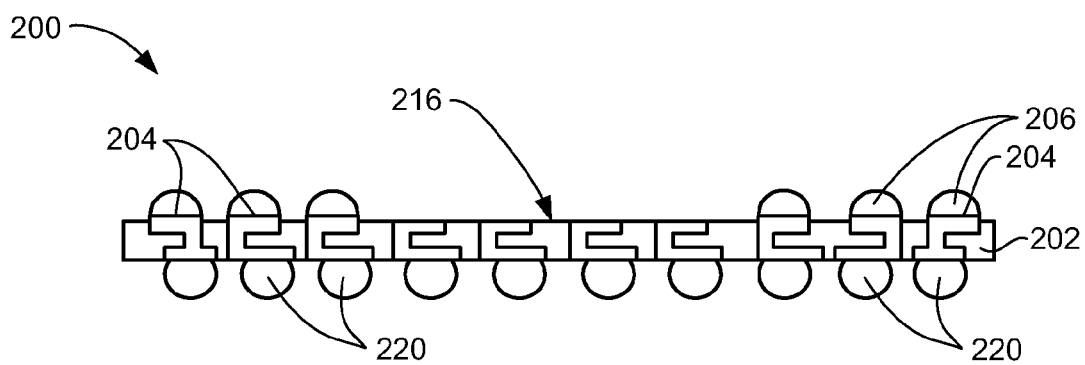
FIG. 2A is a view of a base package according to an embodiment of the present invention.

Referring now to FIG. 2A, therein is shown a base package 200 according to an embodiment of the present invention. The base package 200 includes a substrate 202 having landing pads 204 on the top surface thereof. Solder caps 206 are formed on top of the landing pads 204. The solder caps 206 are called "caps" because they are mounds of solder that have a solder volume at least several times greater than the thin conventional solder films previously used just to coat the surface of landing pads such as the landing pads 204.

In some embodiments, the solder caps 206 can be formed on the substrate 202 of the base package 200 by means of solder paste printing, electroplating, or electroless plating by masking, for example. In other embodiments, solder ball attach techniques can be employed to form the solder caps 206. In each of these cases, the solder caps 206 will have the known characteristics of having been so formed.

Figure 2B:
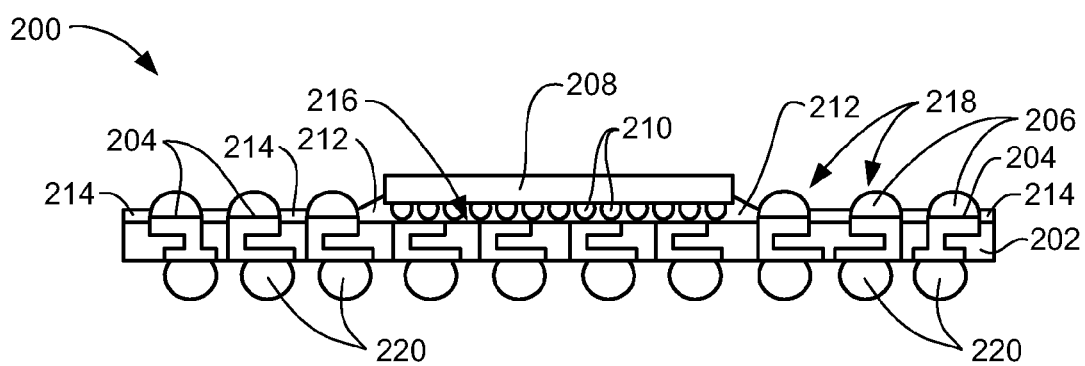
FIG. 2B is a view of the base package following attachment of a semiconductor device onto the top surface thereof.

Referring now to FIG. 2B, therein is shown the base package 200 following attachment of a semiconductor device, such as a package or a die 208, onto the top surface of the substrate 202. The die 208 may be attached, for example, by means of a flip chip configuration having solder balls 210 between the die 208 and the substrate 202. Such a flip chip configuration typically also has a resin underfill 212 in the space between the solder balls 210 and the substrate 202. As is known, the resin underfill 212 can also result in a resin bleed 214 flowing outwardly onto the top surface of the substrate 202.

In yet another, possibly more efficient embodiment, solder caps such as the solder caps 206 can be formed, using known techniques, simultaneously with the formation of a solder-on-pad ("SOP") finish. The SOP finish may be formed, for example, on a flip chip site 216 on the top of the substrate 202 to which the die 208 is subsequently attached, thereby eliminating many additional process steps. (In FIG. 2B the SOP finish, which includes the solder balls 210, has been occupied by the die 208.) The solder caps 206 and the SOP finish will then have the characteristics (composition, metallurgical structure, and so forth) of having been formed simultaneously.

It has been discovered that the landing pads 204 can be either solder mask defined ("SMD") or non-solder mask defined ("NSMD"), and that the solder caps 206 can then be formed into a solder mask that protects the landing pads 204 from the resin bleed 214. Similarly, solder caps can be formed on landing pads on routing traces, and so forth, to provide protection from resin bleed in the same manner. In particular, as shown in FIG. 2B, the solder caps 206 protrude above the resin bleed 214. By protruding above the resin bleed 214, the solder caps 206 are thus protected from the resin bleed 214, because the solder caps 206 are not covered or obstructed by the resin bleed, as occurs sometimes with prior conventional thin solder films.

It has also been discovered that the solder caps 206 can be configured to form a solder mask dam 218, which provides a ledge to block solder flow around the die 208, and further limit resin bleed onto the substrate 202.

Formed thus, the solder caps 206 remain exposed and available for connection to the solder balls 124 (FIG. 1) of the top package 100 (FIG. 1).

The base package 200 is also provided with solder balls 220 on the bottom thereof, forming, for example, a ball grid array ("BGA").

Figure 3:
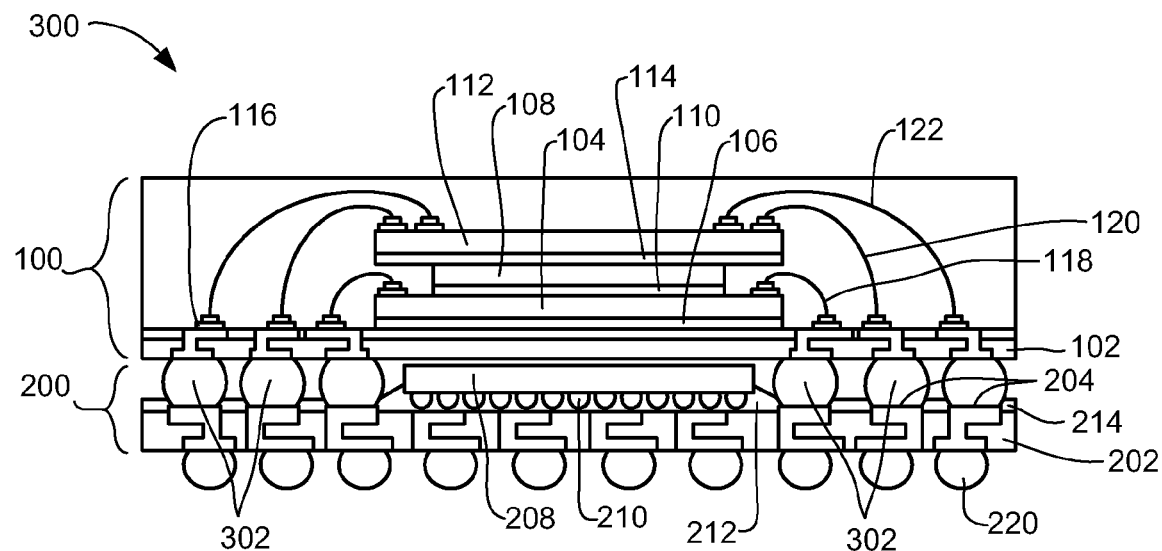
FIG. 3 is a view of an assembled package consisting of the top package of FIG. 1 attached to the base package of FIG. 2B.

Referring now to FIG. 3, therein is shown an assembled package 300 consisting of the base package 200 shown in FIG. 2B onto which the top package 100 has been attached by means of the solder balls 124 (FIG. 1) and the solder caps 206 (FIG. 2B). The solder balls 124 have merged, such as by a solder reflow process, with the solder caps 206 to form merged, larger solder balls 302. The larger solder balls 302 provide greater headroom or stand-off for the die 208, as well as a very fine ball pitch capability due to the smaller sizes of the constituent elements (i.e., the solder balls 124 and the solder caps 206). These unique characteristics of the larger solder balls 302 (e.g., larger solder ball size combined with very fine ball pitch capability) are an unexpected result of forming the larger solder balls 302 by merging the solder balls 124 of the present invention with the solder caps 206 of the present invention. Similarly, the larger solder balls 302 will also carry the unique and determinable characteristics of the histories of their precursor constituents (i.e., the solder balls 124 and the solder caps 206) including the characteristics of how these precursor constituents were formed (e.g., by solder paste printing, by solder ball attach, by formation in the same step as the formation of a solder-on-pad finish on a flip chip site, and so forth).

Figure 4:
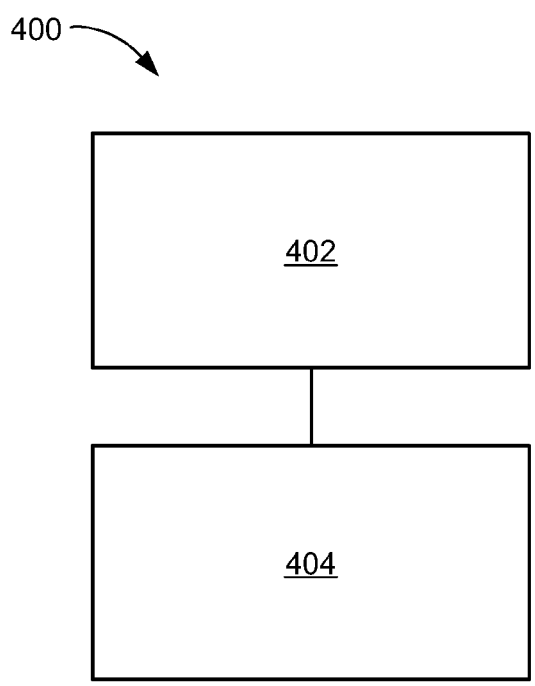
FIG. 4 is a flow chart of a method of manufacture of an integrated circuit package-on-package system in accordance with an embodiment of the present invention.

Referring now to FIG. 4, therein is shown a flow chart of a method 400 of manufacture of an integrated circuit package-on-package system 300 in accordance with an embodiment of the present invention. The method 400 includes providing a base package in a block 402; and providing solder caps on the top of the base package configured to protrude above subsequent resin bleed, and configured for merging with solder balls of a top package to form larger solder balls between such a top package and the base package, in a block 404.

Accordingly, a PoP system, according to one embodiment of the present invention, is performed as follows:
1. The top package 100 is provided. (FIG. 1) The top package has solder balls 124 on the bottom thereof for connection to and mounting onto the base package 200.
2. The base package 200 is provided having the landing pads 204 thereon, and the solder caps 206 are formed on the landing pads 204. (FIG. 2A)
3. The top package 100 is then assembled onto the base package 200 by merging the solder balls 124 with the solder caps 206 to form the larger solder balls 302 therebetween. (FIG. 3)

It has been unexpectedly discovered that the present invention thus has numerous aspects.

A principle aspect that has been unexpectedly discovered is that the present invention inexpensively and efficiently provides sufficient headroom to accommodate conventional and existing dies and packages on the base package, between the base package and the top package.

Another aspect that has been unexpectedly discovered is that the ball pitch of the solder balls on the bottom of the top package and the landing pads on the top of the base package can be much finer without sacrificing the headroom therebetween.

Still another aspect that has been unexpectedly discovered is that the solder caps can be configured to form solder mask dams to control resin bleed.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the PoP system of the present invention furnishes important and heretofore unknown and unavailable solutions, capabilities, and functional aspects for PoP systems. The resulting processes and configurations are straightforward, cost-effective, uncomplicated, highly versatile and effective, can be surprisingly and unobviously implemented by adapting known technologies, and are thus readily suited for efficiently and economically manufacturing PoP systems with conventional manufacturing processes and technologies.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A package-on-package packaging method, comprising:
providing a base package; and
providing solder caps on the top of the base package:
    configured to protrude above subsequent resin bleed, the resin bleed extending to an edge of the base package;
    configured for merging with solder balls of a top package to form larger solder balls between such a top package and the base package; and
forming a solder mask dam on the top of the base package to protect from the resin bleed.

2. The method as claimed in claim 1 wherein providing the solder caps further comprises solder paste printing, electroplating, electroless plating, or solder ball attaching.

3. The method as claimed in claim 1 wherein providing the solder caps further comprises forming the solder caps in the same step as the formation of a solder-on-pad finish on a flip chip site on the base package.

4. The method as claimed in claim 1 further comprising:
providing a top package having solder balls on the bottom thereof; and
assembling the top package onto the base package by merging the solder balls with the solder caps.

5. A package-on-package packaging method, comprising:
providing a base package having landing pads on the top thereof;
providing solder caps on the landing pads on the top of the base package:
    configured to protrude above subsequent resin bleed, the resin bleed extending to an edge of the base package, to protect from resin bleed obstruction; and
    configured for merging with solder balls of a top package to form larger solder balls between such a top package and the base package;
forming a solder mask dam on the top of the base package to limit the resin bleed; and
attaching a semiconductor device onto the top of the base package, the solder mask dam around the semiconductor device.

6. The method as claimed in claim 5 wherein providing the solder caps further comprises solder paste printing, electroplating, electroless plating, or solder ball attaching.

7. The method as claimed in claim 5 wherein providing the solder caps further comprises forming the solder caps in the same step as the formation of a solder-on-pad finish on a flip chip site on the top of the base package.

8. The method as claimed in claim 5 further comprising:
providing a top package having solder balls on the bottom thereof for connection to and mounting onto the base package; and
assembling the top package onto the base package by merging the solder balls with the solder caps to form larger solder balls between the top package and the base package.

* * * * *